United States Patent
Hong

(10) Patent No.: US 8,331,121 B2
(45) Date of Patent: Dec. 11, 2012

(54) MULTI-CHIP PACKAGES PROVIDING REDUCED SIGNAL SKEW AND RELATED METHODS OF OPERATION

(75) Inventor: YoungSeok Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 228 days.

(21) Appl. No.: 12/710,405

(22) Filed: Feb. 23, 2010

(65) Prior Publication Data
US 2010/0265751 A1  Oct. 21, 2010

(30) Foreign Application Priority Data
Apr. 15, 2009  (KR) .................. 10-2009-0032948

(51) Int. Cl.
G11C 5/02 (2006.01)
H01L 23/52 (2006.01)
H01L 25/00 (2006.01)
H01L 23/02 (2006.01)

(52) U.S. Cl. ............. 365/51; 365/63; 257/777; 257/686

(58) Field of Classification Search .................. 365/51, 365/63; 257/777, 686, 678, 734; 327/565
See application file for complete search history.

(56) References Cited

U.S. PATENT DOCUMENTS

| | | | |
|---|---|---|---|
| 6,621,155 B1 * | 9/2003 | Perino et al. .................. | 257/686 |
| 7,327,038 B2 * | 2/2008 | Kwon et al. .................. | 257/777 |
| 8,004,071 B2 * | 8/2011 | Nishiyama et al. ........... | 257/676 |
| 8,059,443 B2 * | 11/2011 | McLaren et al. ............... | 365/64 |
| 2006/0055018 A1 | 3/2006 | Sekiguchi et al. | |
| 2006/0076690 A1 * | 4/2006 | Khandros et al. ............. | 257/777 |

* cited by examiner

Primary Examiner — VanThu Nguyen
Assistant Examiner — Hai Pham
(74) Attorney, Agent, or Firm — Myers Bigel Sibley & Sajovec, P.A.

(57) ABSTRACT

A packaged integrated circuit device includes a substrate including a conductive pad thereon, and a chip stack including a plurality of chips on the substrate. A primary conductive line electrically connects the pad on the substrate to a conductive pad on one of the plurality of chips in the chip stack. Secondary conductive lines electrically connect the pad on the one of the plurality of chips to respective conductive pads on ones of the plurality of chips above and below the one of the plurality of chips in the chip stack. The primary conductive line may be configured to transmit a signal from the pad on the substrate to the pad on the one of the plurality of chips in the chip stack. After receiving the signal at the one of the plurality of chips, the secondary conductive lines may be configured to transmit the signal from the one of the plurality of chips to the ones of the plurality of chips above and below the one of the plurality of chips in the chip stack at a same time. Related methods of operation are also discussed.

22 Claims, 7 Drawing Sheets

MULTI-CHIP PACKAGES PROVIDING REDUCED SIGNAL SKEW AND RELATED METHODS OF OPERATION

CROSS-REFERENCE TO RELATED APPLICATION

This U.S. non-provisional patent application claims priority under 35 U.S.C. §119 from Korean Patent Application No. 10-2009-0032948 filed on Apr. 15, 2009, the disclosure of which is hereby incorporated by reference herein in its entirety.

BACKGROUND

The present inventive concept relates to integrated circuit devices and related methods of operation.

Advances in semiconductor manufacturing technologies continue to improve the integrity and decrease the size of semiconductor devices. However, providing such advances in semiconductor devices fabrication may be expensive, for example, due to costs that may be required to upgrade the facilities and/or equipment used in wafer fabrication, in addition to research-related costs. For instance, in semiconductor memory devices, upgrading a fabrication process used to produce a 64 megabit (Mb) dynamic random access memory (DRAM) devices to allow for production of 256 Mb DRAM devices may involve significant costs.

Semiconductor device manufacturers have introduced fabrication methods whereby a plurality of semiconductor chips are placed into one package. In particular, two or more semiconductor chips may be arranged or "stacked" one on top of the other, to provide a stacked multi-chip package (MCP). The stacking of multiple semiconductor chips in one package may improve the integrity and/or performance of semiconductor devices without requiring the fabrication of new wafer. For example, a 256 Mb DRAM device can be fabricated by assembling four 64 Mb DRAM semiconductor memory chips in the same package.

FIG. 1A illustrates an example of a stacked semiconductor package 100 including second, third, and fourth semiconductor chips 102-104 that are stacked offset on a first semiconductor chip 101, such that a portion of each of the semiconductor chips 101-104 is exposed. A bonding wire 112 electrically connects an exposed pad on a substrate 10 to the first semiconductor chip 101, to the second semiconductor chip 102, to the third semiconductor chip 103, and to the fourth semiconductor chip 104 in a step-by-step manner, from the bottommost chip 101 to the topmost chip 104.

However, the more semiconductor chips that are stacked in a package, the greater the signal delay may be among the chips in the package. FIG. 1B illustrates a package 100' including eight chips 101-108 in a chip stack, where a bonding wire 112' electrically connects the exposed pad on the substrate 10 to each of the chips 101-108. Accordingly, if the time required to transmit a signal from the substrate 10 to the first chip 101 in the stack is 't', the time required to transmit a signal to the eighth chip 108 in the stack may be '8t'. Therefore, providing additional chips in a package may increase the signal delay time among the offset-stacked semiconductor chips.

SUMMARY

According to some embodiments of the present inventive concept, a packaged integrated circuit device includes a substrate including a conductive pad thereon, and a chip stack including a plurality of chips on the substrate. A primary conductive line electrically connects the conductive pad on the substrate to a conductive pad on one of the plurality of chips in the chip stack that is not directly on the substrate, and secondary conductive lines electrically connect the pad on the one of the plurality of chips to respective conductive pads on ones of the plurality of chips above and below the one of the plurality of chips in the chip stack.

In some embodiments, the primary conductive line may be configured to transmit a signal from the pad on the substrate to the pad on the one of the plurality of chips in the chip stack, and the secondary conductive lines may be configured to transmit the signal from the one of the plurality of chips to the ones of the plurality of chips above and below the one of the plurality of chips in the chip stack at a same time responsive to receiving the signal at the one of the plurality of chips.

In some embodiments, a total signal skew between receiving the signal at the one of the plurality of chips and receiving the signal at a last one of the plurality of chips in the chip stack via the secondary conductive lines may be less than a signal skew when the signal is sequentially transmitted from a first one to the last one of the plurality of chips in the stack.

In some embodiments, a first one of the secondary conductive lines may connect the one of the plurality of chips to the ones of the plurality of chips thereabove in series, and a second one of the secondary conductive lines may connect the one of the plurality of chips to the ones of the plurality of chips therebelow in series such that, after receiving the signal at the one of the plurality of chips, a time delay for receiving the signal may be substantially similar for ones of the plurality of chips that are similarly positioned on opposite sides of the one of the plurality of chips.

In some embodiments, the device may further include a ternary conductive line connecting one of the respective pads on a last one of the plurality of chips that is connected to one of the secondary conductive lines to a conductive pad on another one of the plurality of chips that is not directly thereon. The ternary conductive line may be configured to transmit the signal from the last one of the plurality of chips to the another one of the plurality of chips. Quaternary conductive lines may connect the conductive pad on the another one of the plurality of chips to respective conductive pads on ones of the plurality of chips in the chip stack above and below the another one of the plurality of chips. The quaternary conductive lines may be configured to simultaneously transmit the signal from the another one of the plurality of chips to the respective conductive pads on the ones of the plurality of chips thereabove and therebelow.

In some embodiments, the signal transmitted via the primary and secondary conductive lines may be at least one of an address signal, a data signal, and a command signal.

In some embodiments, the one of the plurality of chips may be positioned in the chip stack near a middle position thereof.

In some embodiments, the one of the plurality of chips and the chips therebelow may define a first chip stack of a first multi-chip package. The ones of the plurality of chips above the one of the plurality of chips may define a second chip stack of a second multi-chip package to provide a package-on-package (PoP) structure. The second multi-chip package may include a second substrate having the second chip stack thereon. The second substrate may include a conductive pad thereon and external terminals electrically connected to the pad on the one of the plurality of chips in the first chip stack. One of the secondary conductive lines may connect the pad on the second substrate to the plurality of chips of the second chip stack.

In some embodiments, the primary conductive line may include a first primary conductive line connecting the pad on the substrate to a controller chip that is configured to control operations of the plurality of chips in the chip stack, and a second primary conductive line connecting the controller chip to the one of the plurality of chips in the chip stack.

In some embodiments, the primary conductive line may be a wirebond directly connecting the pad on the substrate to the pad on the one of the plurality of chips. The secondary conductive lines may include a first wirebond connecting the pad on the one of the plurality of chips to the respective pads on the ones of the plurality of chips thereabove, and a second wirebond connecting the pad on the one of the plurality of chips to the respective pads on the ones of the plurality of chips therebelow.

In some embodiments, the primary conductive line may be at least one of a wirebond and a through molded via (TMV) directly connecting the pad on the substrate to the one of the plurality of chips. The secondary conductive lines may respectively be conductive vias extending through the ones of the plurality of chips above and below the one of the plurality of chips.

In some embodiments, the plurality of chips in the chip stack may be one of flash memory, dynamic random access memory (DRAM), static random access memory (SRAM), resistive random access memory (RRAM), and magnetic random access memory (MRAM) chips.

In some embodiments, the plurality of chips in the chip stack may include eight memory chips or more.

In some embodiments, the packaged integrated circuit device may be included in a memory unit of a memory storage device. The memory storage device may further include a controller and a printed circuit board including the controller and the memory unit thereon and configured to provide communication therebetween.

In some embodiments, the packaged integrated circuit device may be included in at least one of the processor and a memory unit of an electronic system. The electronic system may further include an input/output unit, and a bus that communicatively couples the processor, the memory, and the input/output unit.

According to further embodiments of the present inventive concept, a method of operating an integrated circuit device including a substrate and a chip stack including a plurality of chips thereon includes transmitting a signal from a conductive pad on the substrate to one of the plurality of chips in the chip stack via a primary conductive line that connects the pad on the substrate to a conductive pad on one of the plurality of chip. The one of the plurality of chips is not directly on the substrate. The signal is then simultaneously transmitted from the one of the plurality of chips to ones of the plurality of chips above and below the one of the plurality of chips in the chip stack via secondary conductive lines that connect the pad on the one of the plurality of chips to respective conductive pads on the ones of the plurality of chips above and below the one of the plurality of chips in the chip stack.

In some embodiments, the signal may be serially transmitted to the ones of the plurality of chips above the one of the plurality of chips via a first one of the secondary conductive lines that connects the one of the plurality of chips to the ones of the plurality of chips thereabove, and serially transmitted to the ones of the plurality of chips below the one of the plurality of chips via a second one of the secondary conductive lines that connects the one of the plurality of chips to the ones of the plurality of chips therebelow. After receiving the signal at the one of the plurality of chips, a time delay for receiving the signal may be substantially similar for ones of the plurality of chips that are similarly positioned on opposite sides of the one of the plurality of chips.

In some embodiments, the signal may be transmitted from one of the respective pads on a last one of the plurality of chips connected to one of the secondary conductive lines to a conductive pad on another one of the plurality of chips that is not directly thereon via a ternary conductive line, and simultaneously transmitted from the pad on the another one of the plurality of chips to respective conductive pads on ones of the plurality of chips in the chip stack above and below the another one of the plurality of chips via quaternary conductive lines.

In some embodiments, the primary conductive line may include a first primary conductive line connecting the pad on the substrate to a controller chip that is configured to control operations of the plurality of chips in the chip stack, and a second primary conductive line connecting the controller chip to the one of the plurality of chips in the chip stack. The signal may be transmitted from the pad on the substrate to the one of the plurality of chips in the chip stack by transmitting a control signal from the substrate to the controller chip via the first primary conductive line, and then transmitting the signal from the controller chip to the one of the plurality of chips in the chip stack via the secondary conductive line.

According to further embodiments of the present inventive concept, a method of fabricating a packaged integrated circuit device includes providing a substrate including a conductive pad thereon, and providing a chip stack including a plurality of chips on the substrate. A primary conductive line is provided to connect the pad on the substrate to a conductive pad on one of the plurality of chips in the chip stack that is not directly on the substrate. Secondary conductive lines are provided to connect the pad on the one of the plurality of chips to respective conductive pads on ones of the plurality of chips above and below the one of the plurality of chips in the chip stack. The primary conductive line may be configured to transmit a signal from the substrate to the one of the plurality of chips in the chip stack, and the secondary conductive lines may be configured to transmit the signal from the one of the plurality of chips to the ones of the plurality of chips above and below the one of the plurality of chips in the chip stack at a same time.

Other elements and/or devices according to some embodiments will become apparent to one with skill in the art upon review of the following drawings and detailed description. It is intended that all such additional devices, in addition to any combination of the above embodiments, be included within this description, be within the scope of the inventive concept, and be protected by the accompanying claims.

DETAILED DESCRIPTION OF EMBODIMENTS

Figure 1A:
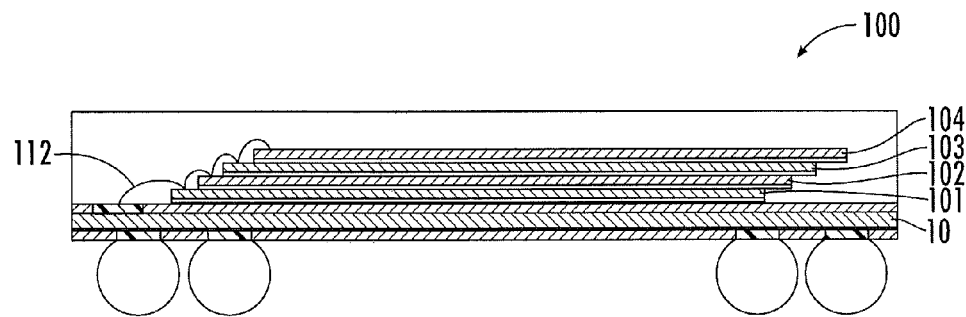
FIGS. 1A and 1B are cross-sectional views illustrating packaged integrated circuit devices including multiple semiconductor chips in a stack.

The present inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Some embodiments of the present inventive concept provide multi-chip packages (MCP) including a primary conductive line electrically connecting a pad on a substrate to a conductive pad on one of the plurality of chips in the chip stack that is not directly on the substrate, and secondary conductive lines electrically connecting the pad on the one of the plurality of chips to respective conductive pads on ones of the plurality of chips above and below the one of the plurality of chips in the chip stack. The primary conductive line transmits a signal from the pad on the substrate to the pad on the one of the plurality of chips in the chip stack, and the secondary conductive lines simultaneously transmit the signal to the ones of the plurality of chips above and below the one of the plurality of chips in the chip stack, so as to reduce signal delay or skew among the chips in the chip stack as compared to sequential transmission of a signal from a first to a last one of the chips in the stack. As used herein, "signal delay" or "signal skew" refers to a phenomenon in which a signal is received at different chips in a chip stack at different times.

Figure 2A:
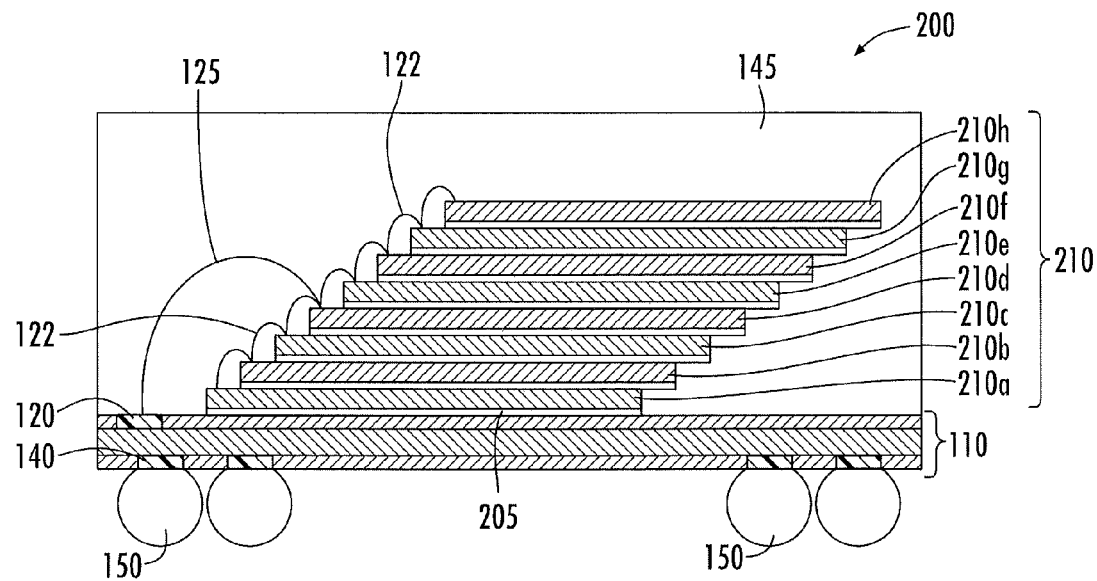
FIG. 2A is a cross-sectional view illustrating a packaged integrated circuit device according to some embodiments of the present inventive concept.
Figure 2B:
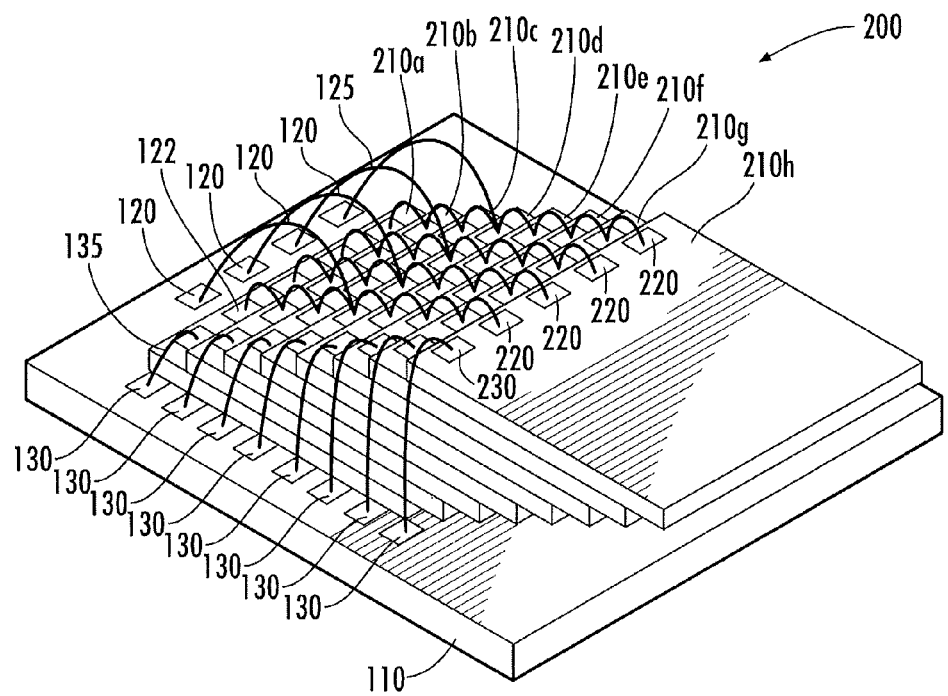
FIG. 2B is a perspective view illustrating the packaged integrated circuit device of FIG. 2A.

FIG. 2A is a cross-sectional view illustrating a packaged integrated circuit device 200 according to some embodiments of the present inventive concept, while FIG. 2B is a perspective view illustrating the packaged integrated circuit device of FIG. 2A. Referring now to FIGS. 2A and 2B, the device 200 includes a chip stack 210 including eight chips 210*a*-210*h* stacked offset on a substrate 110, such that a portion of each of the semiconductor chips 210a-210h is exposed. An adhesive layer 205 is provided between each chip in the chip stack 210, and a molding compound 145 protects the chips 210a-210h of the chip stack 210 and the conductive lines 125, 122, and 135 on the substrate 110. The substrate 110 may be a printed circuit board (PCB), and may be rigid or flexible (such as a tape board). The substrate 110 includes conductive pads or bonding fingers 120 and 130 on a first surface thereof, and bump pads 140 on a second surface thereof. The bump pads 140 provide connections to external terminals 150, which may be used for input/output with external devices. As illustrated in FIG. 2A, the external terminals 150 may be solder bumps or balls; however, other metal bumps or leads may be used to provide the external terminals 150 in some embodiments. The conductive pads 120 provide control, addressing, and/or data signals to the chips 210a-210h in the chip stack 210 via primary and secondary conductive lines 125 and 122, while the conductive pads 130 provide chip select signals to the chips 210a-210h in the chip stack 210 via chip select lines 135.

More particularly, the primary conductive lines 125 directly connect the conductive pads 120 on the substrate to respective conductive pads 220 on the chip 210d. The secondary conductive lines 122 electrically connect the conductive pads 220 on the chip 210d to respective conductive pads 220 on the chips 210e-210h above the chip 210d, and to respective conductive pads 220 on the chips 210a-210c below the chip 210d. As such, a first one of the secondary conductive lines 122 connects the chip 210d to the chips 210e-210h in series, and a second one of the secondary conductive lines 122 connects the chip 210d to the chips 210c-210a in series. The chip 210d may be positioned near a middle of the chip stack 210, so as to substantially equalize the electrical lengths of the secondary conductive lines 122 (and the resulting signal skew). The chip select lines 135 connect each conductive pad 130 on the substrate 110 to a conductive pad 230 on a different one of the chips 210a-210h in the chip stack 210. The primary and/or secondary conductive lines and/or the chip select lines may be bonding wires in some embodiments.

Although illustrated in FIGS. 2A-2B with reference to chips 210a-210h stacked directly on one another, it will be understood that an interposer or intermediate substrate (such as a silicon substrate, a polymer substrate, circuit board, or other passive element) may be provided between one or more of the chips 210a-210h in the chip stack. Moreover, while the chip stack 210 is illustrated as including eight chips, it will be understood that the chip stack 210 may include fewer or more chips in some embodiments. Also, the conductive pads 220 on each of the chips 210a-210h may be provided in a one or two row arrangement. The chips 210a-210h may be semiconductor logic chips, such as used in controllers and/or microprocessors, or semiconductor memory chips, such as flash memory, dynamic random access memory (DRAM), ferroelectric random access memory (FeRAM), phase-changeable random access memory (PRAM), magnetic random access memory (MRAM), and/or resistive random access memory (RRAM).

Figure 3:
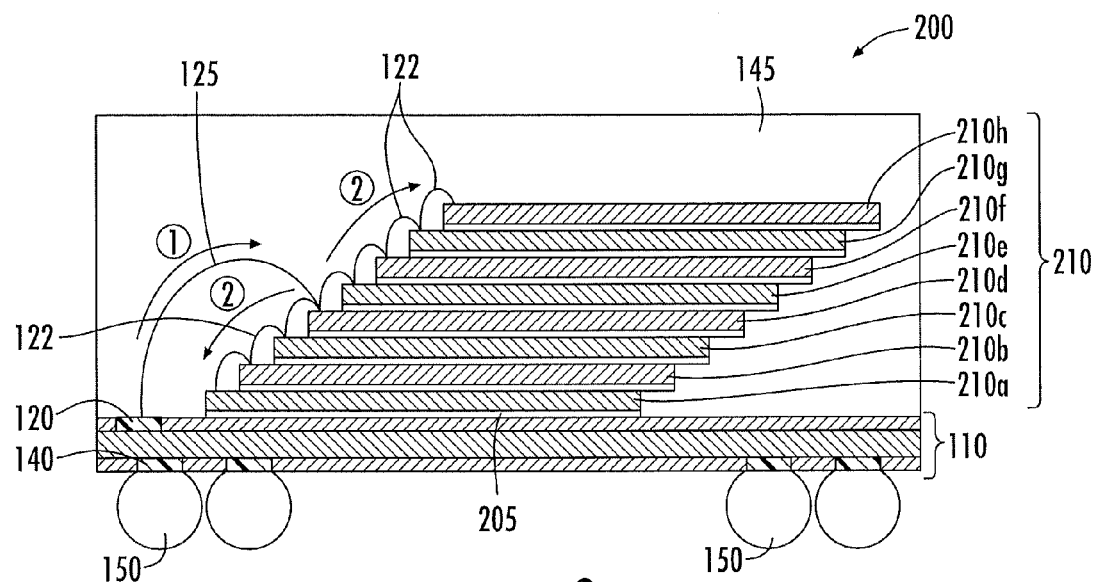
FIGS. 3 and 4 illustrate signal delay in a packaged integrated circuit device according to some embodiments of the present inventive concept as illustrated in FIGS. 2A-2B.
Figure 4:
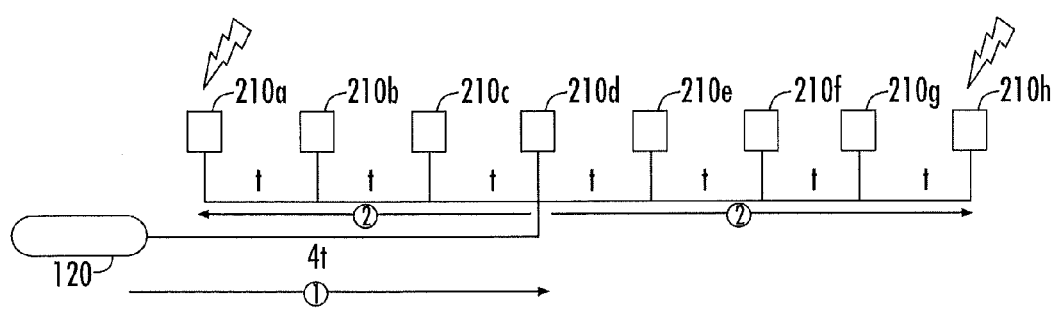

FIGS. 3 and 4 illustrate signal delay or skew in the packaged integrated circuit device 200 of FIGS. 2A-2B. Referring now to FIGS. 3 and 4, a signal is transmitted from a conductive pad 120 on the substrate 110 to one of the chips 210a-210h in the chip stack 210 via the primary conductive line 125. The signal may be, for example, a control, addressing, or data signal. In particular, the signal is transmitted to a conductive pad 220 on the chip 210d, which is positioned near a middle of the chip stack 210, as shown by (1). The signal is then simultaneously relayed from the chip 210d to the respective conductive pads 220 on the chips 210e-210h thereabove and the chips 210a-210c therebelow via the secondary conductive lines 122, as shown by (2), so as to reduce the signal delay among the chips 210a-210h in the chip stack 210 as compared to sequentially transmitting the signal from the first chip 210a to the last chip 210h. In particular, the signal is serially transmitted from chip 210d to 210e to 210f to 210g to 210h, and from chip 210d to 210c to 210b to 210a, in parallel, via the secondary conductive lines 122.

As shown in FIG. 4, a transmittance time of 't' denotes the time required to transmit the signal from one chip to another. As such, a transmittance time of about '4t' is required to transmit the signal from the conductive pad 120 on the substrate 110 to the conductive pad 220 on the chip 210d, which is the fourth chip in the stack. Likewise, a transmittance time of about '3t' is required to transmit the signal from the chip 210d to the chip 210a therebelow, while a transmittance time of about '4t' is required to transmit the signal from the chip 210d to the chip 210h thereabove. Accordingly, the total transmittance time required to transmit the signal from the substrate 110 to the last chip 210h in the chip stack 210 is about '8t' (e.g., '4t' from the substrate 110 to the chip 210d, plus '4t' from the chip 210d to the chip 210h). However, the total signal delay or skew for the chip stack 210, which refers to the difference in time between receiving the signal at a first chip in the stack 210 ('4t', in this example) and receiving the signal at a last chip in the stack 210 ('8t', in this example), is only about '4t'.

Figure 1B:
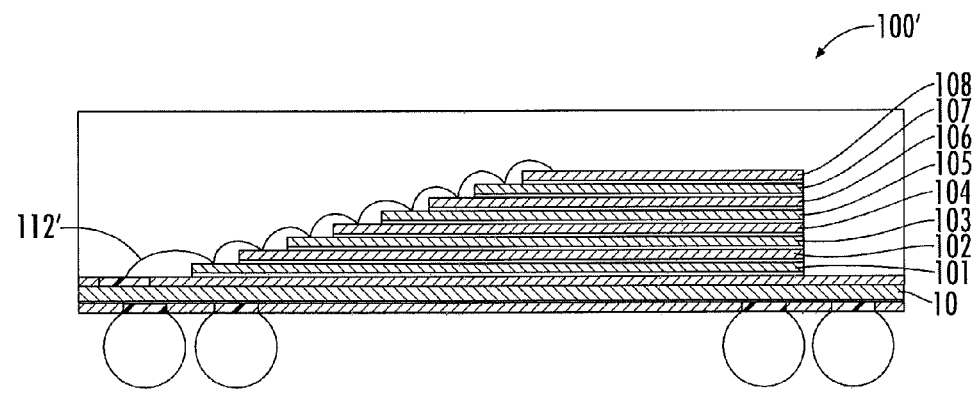

In comparison, with reference to FIG. 1B, a transmittance time of about '1t' is required to transmit the signal from the substrate 10 to the chip 101, while a transmittance time of about '7t' is required to sequentially transmit the signal from the chip 101 to 102 to 103 to 104 to 105 to 106 to 107 to 108, which provides a similar total transmittance time of about '8t'. However, the total signal delay or skew according to the arrangement of FIG. 1B is about '7t' (e.g., the time difference between receiving the signal at the first chip 101 ('1t' and receiving the signal at the last chip 108 ('8t') of the chip stack), as compared to the total signal skew of about '4t' provided by the embodiment of FIG. 2A. Table 1 provides a comparison between the signal skew for the embodiment of FIG. 2A and the embodiment of FIG. 1B.

TABLE 1

| Signal Path | FIG. 2A | FIG. 1B |
| --- | --- | --- |
| Bonding finger to First chip | 4t | t |
| First chip to Last chip | 4t | 7t |
| Total signal delay or skew | 4t | 7t |

Accordingly, embodiments of the present inventive concept may provide a significant reduction in total signal skew as compared to sequential transmission of the signal from a first chip directly on a substrate to a last chip furthest from the substrate, allowing for higher-speed operation. Moreover, the relative time delay for receiving the signal is substantially equalized for chips that are similarly positioned on opposite sides of the chip 210d. In particular, as shown in FIG. 4, the transmittance time of about '4t' for the chips 210e-210h above the chip 210d is substantially equal to the transmittance time of about '3t' for the chips 210a-210c below the chip 210d by using secondary conductive lines 122 of similar electrical length. Accordingly, control, addressing, and/or data signals may be provided to all of the chips 210a-210h in the chip stack 210 while reducing signal skew among the chips 210a-210h, without the use of additional circuitry.

Figure 5:
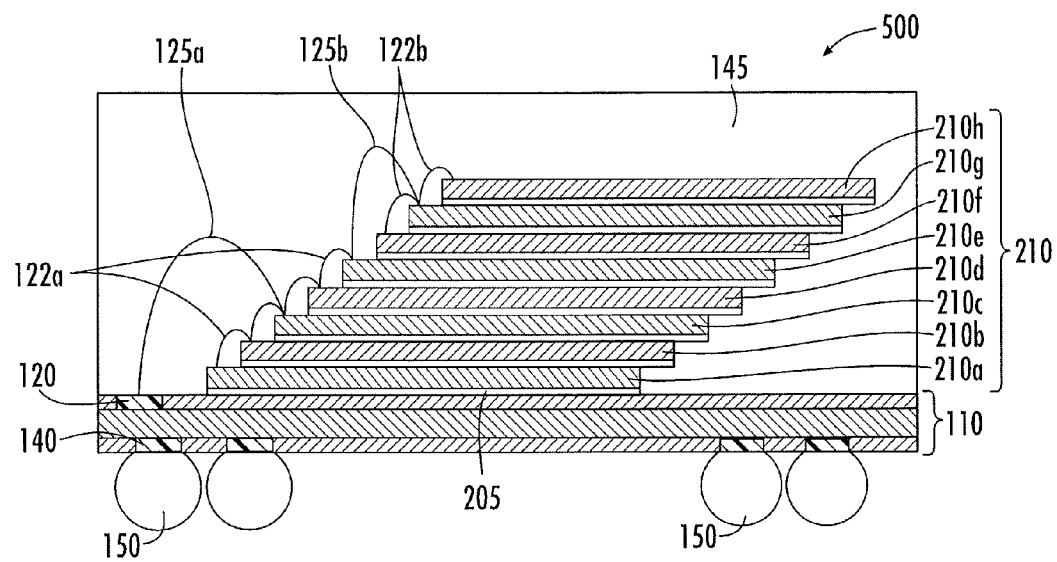
FIG. 5 is a cross-sectional view illustrating a packaged integrated circuit device according to further embodiments of the present inventive concept.

FIG. 5 is a cross-sectional view illustrating a packaged integrated circuit device 500 according to further embodiments of the present inventive concept. The device 500 includes a chip stack 210 including eight chips 210a-210h stacked offset on a substrate 110, such that a portion of each of the semiconductor chips 210a-210h is exposed. The substrate 110 includes conductive pads or bonding fingers 120 on a first surface thereof, and bump pads 140 on a second surface thereof for connection to external terminals 150. An adhesive layer 205 is provided between each chip in the chip stack 210, and a molding compound 145 protects the chips 210a-210h of the chip stack 210 and the conductive lines 125a, 122a, 125b, and 122b, as similarly described above with reference to the embodiment of FIG. 2A. The conductive lines 125a, 122a, 125b, and 122b may likewise transmit control, addressing, and/or data signals to the chips 210a-210h in the chip stack 210. The device 500 may also include chip select lines (not shown) that connect particular conductive pads on the substrate 110 to different ones of the chips 210a-210h in the chip stack 210. The conductive lines and/or the chip select lines may be implemented by bonding wires in some embodiments.

As shown in FIG. 5, primary conductive lines 125a directly connect the conductive pads 120 on the substrate 110 to respective conductive pads 220 on the chip 210c, while secondary conductive lines 122a connect the pads 220 on the chip 210c to respective conductive pads 220 on the chips 210d and 210e thereabove and on the chips 210b and 210a therebelow. Ternary conductive lines 125b connect the conductive pads 220 on the chip 210e to respective conductive pads 220 on the chip 210g, while quaternary conductive lines 122b connect the pads 220 on the chip 210g to respective conductive pads 220 on the chip 210h thereabove and on the chip 210f therebelow. As such, the primary and ternary conductive lines 125a and 125b provide connections between chips that are not in direct contact, while the secondary and quaternary conductive lines 122a and 122b provide serial connections between immediately adjacent chips. It will be understood that fewer or more conductive lines and/or chips may be provided in some embodiments. Also, while illustrated with reference to conductive lines having specific connections, the number and/or positions of the conductive lines may be altered in some embodiments.

Figure 6:
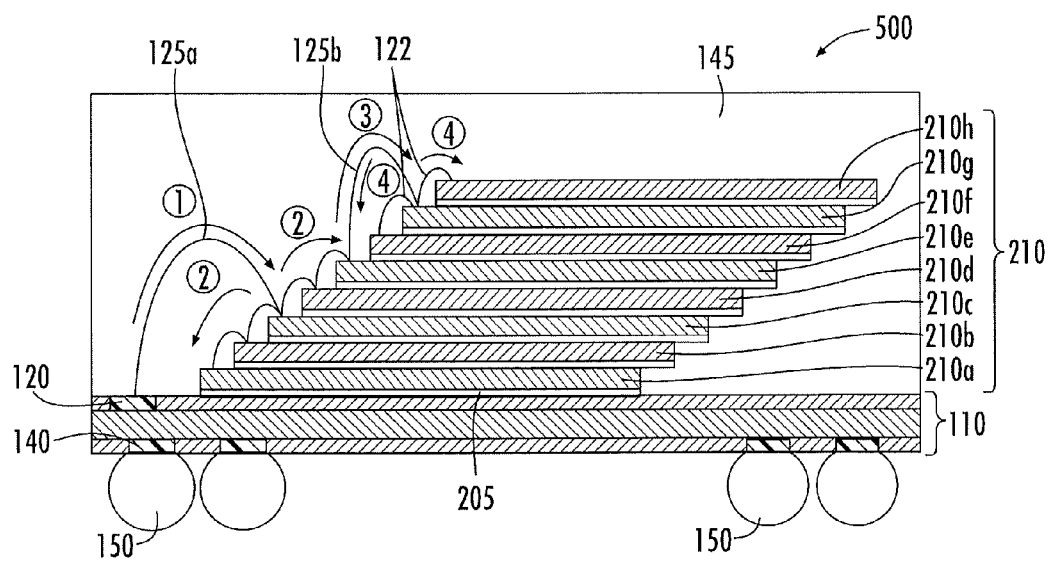
FIGS. 6 and 7 illustrate signal delay in a packaged integrated circuit device according to some embodiments of the present inventive concept as illustrated in FIG. 5.
Figure 7:
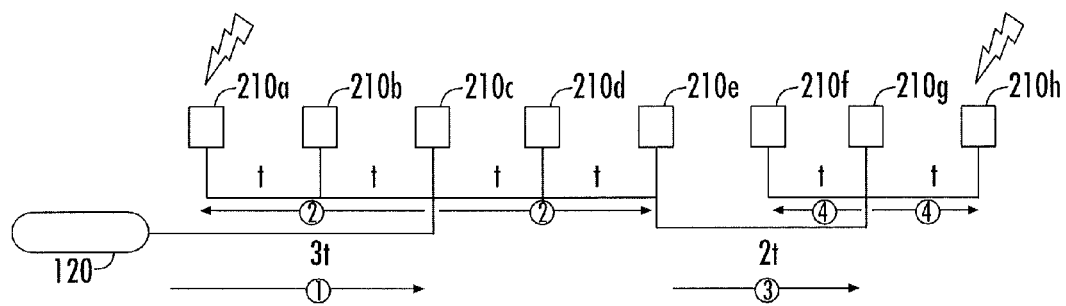

FIGS. 6 and 7 illustrate signal delay in the packaged integrated circuit device 500 of FIG. 5. Referring now to FIGS. 6 and 7, a signal is transmitted from a conductive pad 120 on the substrate 110 to one of the chips 210a-210h in the chip stack 210 via the primary conductive line 125a. The signal may be, for example, a control, addressing, or data signal. In particular, the signal is transmitted to a conductive pad 220 on the chip 210c, as shown by (1). The signal is then simultaneously relayed from the chip 210c to the respective conductive pads 220 on the chips 210d and 210e thereabove and the chips 210b and 210a therebelow via the secondary conductive lines 122a, as shown by (2). In particular, the signal is serially transmitted from chip 210c to 210b to 210a, and from chip 210c to 210d to 210e, in parallel, via the secondary conductive lines 122a. The signal is further transmitted from the chip 210e to a conductive pad 220 on the chip 210g via the ternary conductive line 125b, as shown by (3). The signal is then simultaneously relayed from the chip 210g to the respective conductive pads 220 on the chip 210h thereabove and the chip 210f therebelow, in parallel, via the quaternary conductive lines 122b, as shown by (4).

As shown in FIG. 7, a transmittance time of 't' denotes the time required to transmit the signal from one chip to another. As such, a transmittance time of about '3t' is required to transmit the signal from the conductive pad 120 on the substrate 110 to the conductive pad 220 on the chip 210c, which is the third chip in the stack. Also, a transmittance time of about '2t' is required to transmit the signal from the chip 210c to the chip 210a therebelow, while a transmittance time of about '2t' is required to transmit the signal from the chip 210c to the chip 210e thereabove. Likewise, a transmittance time of about '2t' is required to transmit the signal from the chip 210e to the chip 210g, while a transmittance time of about '1t' is required to transmit the signal from the chip 210g to each of the chips 210f therebelow and 210h thereabove. Accordingly, the total transmittance time required to transmit the signal from the substrate 110 to the last chip 210h in the chip stack 210 is still about '8t' (e.g., '3t' from the substrate 110 to chip 210c, plus '2t' from chip 210c to chip 210e, plus '2t' from chip 210e to chip 210g, plus '1t' from chip 210g to chip 210h). However, the total signal delay or skew for the chip stack 210 (e.g., the time difference between receiving the signal at the first chip 210c ('3t') and receiving the signal at the last chip 210h ('8t') in the chip stack 210) is only about '5t'. Table 2 provides a comparison between the total signal skew for the embodiment of FIG. 5 and the embodiment of FIG. 1B.

TABLE 2

| Signal Path | FIG. 5 | FIG. 1B |
| --- | --- | --- |
| Bonding finger to First chip | 3t | t |
| First chip to Last chip | 5t | 7t |
| Total time delay skew | 5t | 7t |

Accordingly, the total signal skew provided by the embodiment of FIG. 5 (about '5t') allows for a reduction in the total signal skew provided by the arrangement of FIG. 1B (about '7t'). Thus, embodiments of the present inventive concept as shown in FIG. 5 may also provide reduced signal skew among the chips 210a-210h as compared to sequential transmission of the signal from a first chip directly on a substrate to a last chip furthest from the substrate, without the use of additional circuitry.

Figure 8:
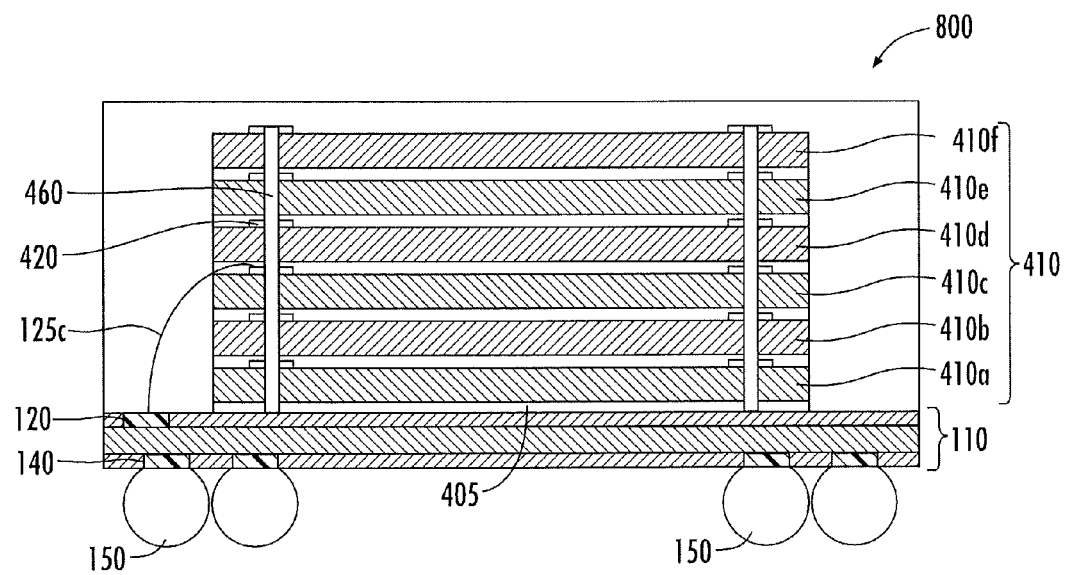
FIG. 8 is a cross-sectional view illustrating a packaged integrated circuit device according to still further embodiments of the present inventive concept.

FIG. 8 is a cross-sectional view illustrating a packaged integrated circuit device 800 according to still further embodiments of the present inventive concept. Referring now to FIG. 8, the device 800 includes a chip stack 410 including six chips 410a-410f stacked on a substrate 110, with an adhesive layer 405 provided between each chip in the chip stack 410. Primary conductive lines 125c (shown in FIG. 8 as wirebonds) directly connect conductive pads 120 on the substrate 110 to respective conductive pad 420 on the chip 410c. Secondary conductive via structures 460 electrically connect the conductive pad on the chip 410c to respective conductive pads 420 on the chips 410d-410f thereabove and the chips 410a-410b therebelow. For example, the secondary conductive vias 460 may be through silicon vias (TSVs) in some embodiments. A molding compound 145 protects the chips 410a-410f of the chip stack 410 and the primary conductive line 125c, as similarly described above with reference to the embodiment of FIG. 2A. The device 800 may also include chip select lines (not shown) that connect particular conductive pads on the substrate 110 to different ones of the chips 410a-410f in the chip stack 410.

Accordingly, in FIG. 8, a signal is transmitted from a conductive pad 120 on the substrate 110 to the chip 410c by the primary conductive line 125c. The signal may be, for example, a control, addressing, or data signal. In particular, the signal is transmitted to a conductive pad 420 on the chip 410c, which is positioned near a middle of the chip stack 210. The signal is then simultaneously relayed from the chip 410c to the respective conductive pads 420 on the chips 410d-410f thereabove and the chips 410a-410b therebelow by the secondary conductive vias 460. In particular, the signal is serially transmitted from chip 410c to 410e to 410f, and from chip 410c to 410b to 410a, in parallel, so as to reduce the signal delay or skew among the chips 410a-410f in the chip stack 410 as compared to sequentially transmitting the signal from the substrate 110 to the first chip 410a to the last chip 410f.

Although illustrated as a wirebonds in FIG. 8, it will be understood that the primary conductive lines may also be implemented as a through-molded vias (TMVs) extending within the molding compound 145 and directly connecting the conductive pads 120 on the substrate to the respective conductive pads 420 on the chip 410c in some embodiments. Also, redistribution lines may be used to electrically connect the conductive pads 420 on the chips to the secondary conductive vias 460 in some embodiments.

Figure 9:
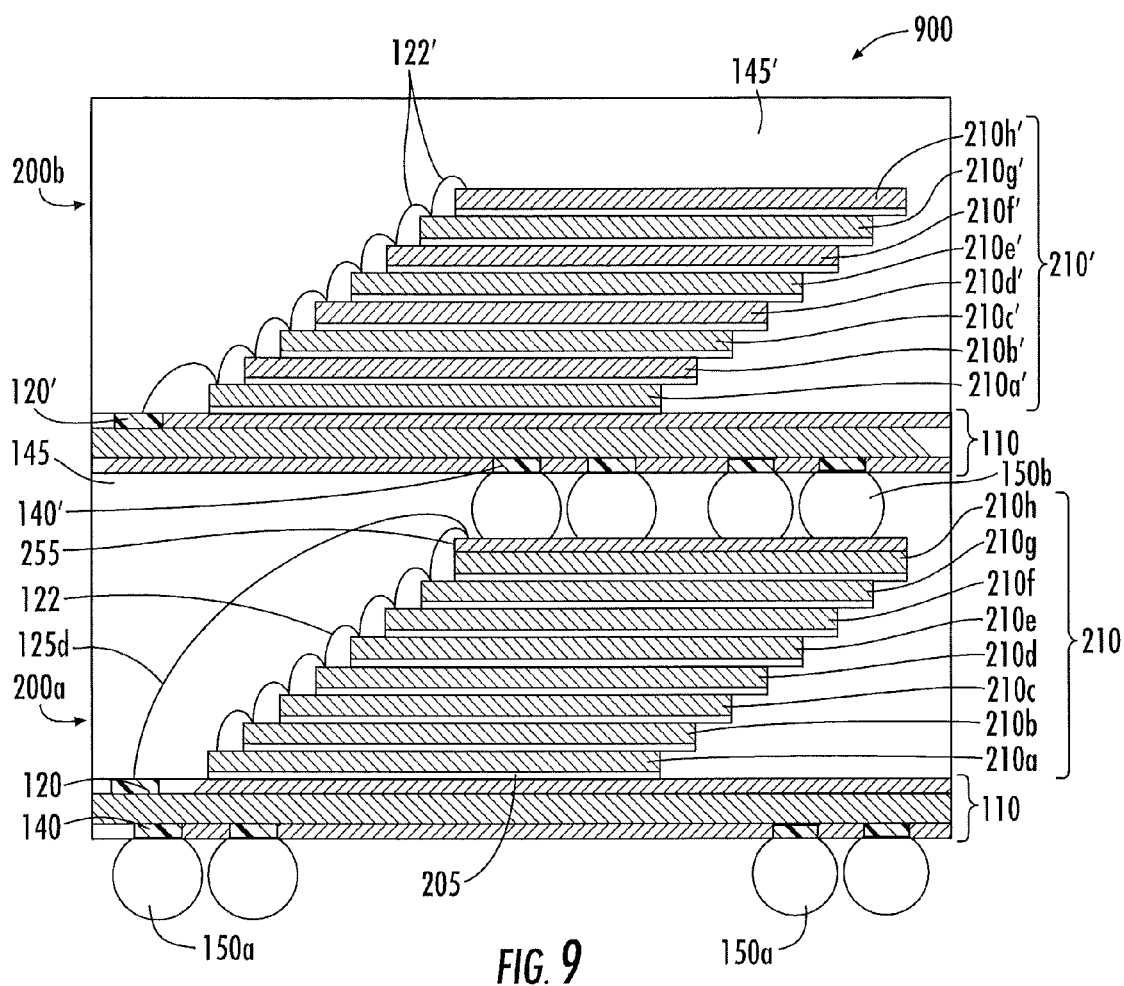
FIG. 9 is a cross-sectional view illustrating a package-on-package integrated circuit device according to some embodiments of the present inventive concept.

FIG. 9 is a cross-sectional view illustrating a package-on-package (PoP) integrated circuit device 900 according to some embodiments of the present inventive concept. Referring now to FIG. 9, the device 900 includes a first semiconductor package 200a and a second semiconductor package 200b stacked thereon. The first package 200a includes a chip stack 210 including eight chips 210a-210h stacked offset on a substrate 110, such that a portion of each of the semiconductor chips 210a-210h is exposed. An adhesive layer 205 is provided between each chip in the chip stack 210, and a molding compound 145 protects the chips 210a-210h of the chip stack 210. The substrate 110 includes conductive pads or bonding fingers 120 on a first surface thereof, and bump pads 140 on a second surface thereof for connection to external terminals 150a. Similarly, the second package 200b includes a chip stack 210' including eight chips 210a'-210h' stacked offset on a substrate 110', such that a portion of each of the semiconductor chips 210a'-210h' is exposed. An adhesive layer 205' is provided between each chip in the chip stack 210', and a molding compound 145' protects the chips 210a'-210h' of the chip stack 210'. The substrate 110' includes conductive pads or bonding fingers 120' on a first surface thereof, and bump pads 140' on a second surface thereof for connection to external terminals 150b. The conductive pads 120 and 120' provide control, addressing, and/or data signals to the chips 210a-210h and 210a'-210h', respectively.

Still referring to FIG. 9, primary conductive lines 125d directly connect conductive pads 120 on the substrate 110 to respective conductive pads on a topmost or last chip 210h of the chip stack 210 of the first package 200a. Secondary conductive lines 122 electrically connect the conductive pads on the chip 210h to respective conductive pads on the chips 210g-210a therebelow in the chip stack 210, such that the chips 210a-210g are connected in series. Secondary conductive lines 122' electrically connect the conductive pads 120' on the substrate 110' to the chips 210a'-210h' of the chip stack 210', such that the chips 210a'-210h' are connected in series. The primary conductive lines 125d and/or the secondary conductive lines 122 and 122' may be implemented using bonding wires in some embodiments.

The chip 210h of the chip stack 210 further includes a redistribution layer 255 thereon to provide an electrical connection between the conductive pad thereon and the chips 210a'-210h' of the chip stack 210'. In particular, the redistribution layer 255 provides an electrical connection to the external terminals 150b of the second package 200b, such that the chips 210a'-210h' of the second package 200b are electrically connected with the bonding finger or conductive pad 120 of the first package 200a by the primary conductive lines 125d. As shown in FIG. 9, the external terminals 150a and 150b may be solder bumps or balls; however, other metal bumps or leads may provide the external terminals 150a and/or 150b in some embodiments.

Accordingly, in FIG. 9, a signal is transmitted from a conductive pad 120 on the substrate 110 to the chip 210h by the primary conductive line 125d. The signal may be, for example, a control, addressing, or data signal. The signal is then simultaneously relayed from the chip 210h to the respective conductive pads on the chips 210g-210a therebelow in the first package 200a via the secondary conductive line 122, and to the chips 210a'-210h' thereabove in the second package via the terminals 150b, bump pads 140', conductive pads 120', and the secondary conductive line 122'. In particular, the signal is serially transmitted from chip 210h to 210g to 210f to 210e to 210d to 210c to 210b to 210a, and from chip 210h to 210a' to 210b' to 210c' to 210d' to 2120e' to 210f' to 210g' to 210h' in parallel, so as to reduce the signal delay or skew among the chips in the chip stack 210 of the first package 200a and the chip stack 210' of the second package 200b.

Figure 10:
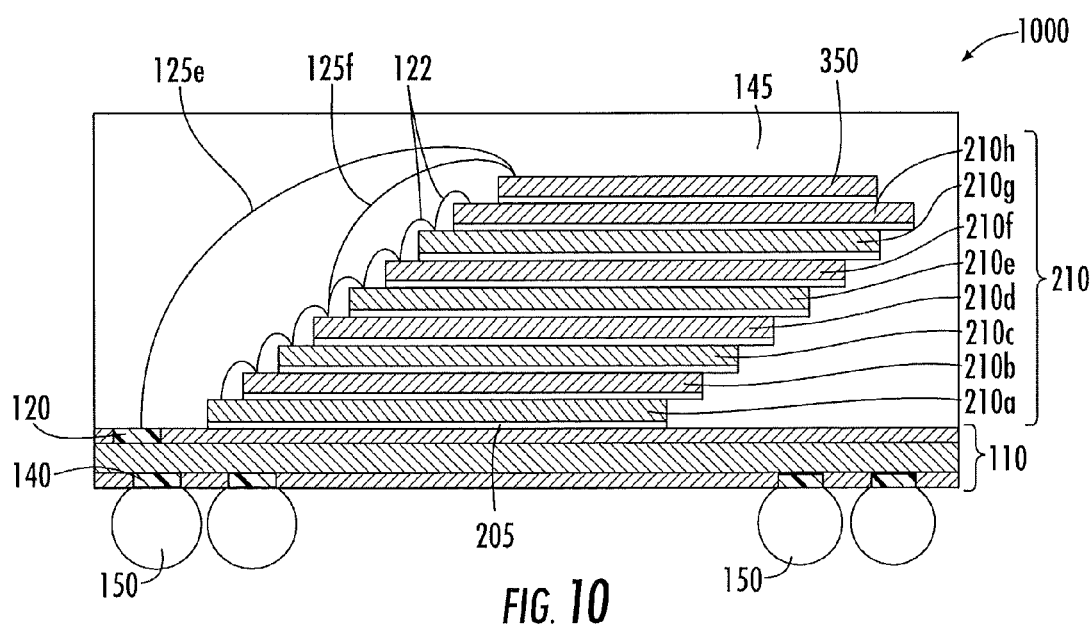
FIG. 10 is a cross-sectional view illustrating a packaged integrated circuit device according to yet further embodiments of the present inventive concept.

FIG. 10 is a cross-sectional view illustrating a packaged integrated circuit device 1000 according to yet further embodiments of the present inventive concept. Referring now to FIG. 10, the device 1000 includes a chip stack 210 including eight chips 210a-210h stacked offset on a substrate 110, such that a portion of each of the semiconductor chips 210a-210h is exposed. The chip stack 210 further includes a controller chip 350 stacked on the topmost chip 210h. The controller chip may be configured to control operations of the chips 210a-210h in the chip stack 210. An adhesive layer 205 is provided between each chip in the chip stack 210, and a molding compound 145 protects the chips 210a-210h and 350 and conductive lines 125e, 125f, and 122 on the substrate 110. The substrate 110 includes conductive pads or bonding fingers 120 on a first surface thereof, and bump pads 140 on a second surface thereof for connection to external terminals 150, which may be used for input/output with external devices.

As shown in FIG. 10, a first primary conductive line 125e directly connects a conductive pad or bonding finger 120 on the substrate 110 to an input of the controller chip 350, and a second primary conductive line 125f directly connects an output of the controller chip 350 to one of the chips 210a-210h in the chip stack 210. In particular, the second primary conductive line 125f electrically connects an output pad of the controller chip 350 to chip 210d of the chip stack 210. Secondary conductive lines 122 electrically connect conductive pads on the chip 210d to respective conductive pads on the chips 210e-210h above the chip 210d, and to respective conductive pads 220 on the chips 210a-210c below the chip 210d. As such, a first one of the secondary conductive lines 122 connects the chip 210d to the chips 210e-210h in series, and a second one of the secondary conductive lines 122 connects the chip 210d to the chips 210c-210a in series. The chip 210d may be positioned near a middle of the chip stack 210, so as to substantially equalize the electrical lengths of the secondary conductive lines 122 (and the resulting signal skew). The device 1000 may also include chip select lines (not shown) that connect particular conductive pads on the substrate 110 to different ones of the chips 210a-210h in the chip stack 210. The primary and/or secondary conductive lines and/or the chip select lines may be bonding wires in some embodiments.

Accordingly, in FIG. 10, a signal is transmitted from a conductive pad 120 on the substrate 110 to a conductive input pad on the controller chip 350 via the first primary conductive line 125e, and an output signal is transmitted from a conductive output pad on the controller chip 350 to the chip 210d in the chip stack 210 via the second primary conductive line 125f. The output signal from the controller chip 350 may be, for example, a control, addressing, or data signal. The signal is then simultaneously relayed from the chip 210d to the respective conductive pads on the chips 210e-210h thereabove and the chips 210c-210a therebelow via the secondary conductive lines 122. In particular, the signal is serially transmitted from chip 210d to 210e to 210f to 210g to 210h, and from chip 210d to 210c to 210b to 210a, in parallel, so as to reduce the signal delay among the chips 210a-210h in the chip stack 210 as compared to sequentially transmitting the signal from the first chip 210a to the last chip 210h.

Figure 11:
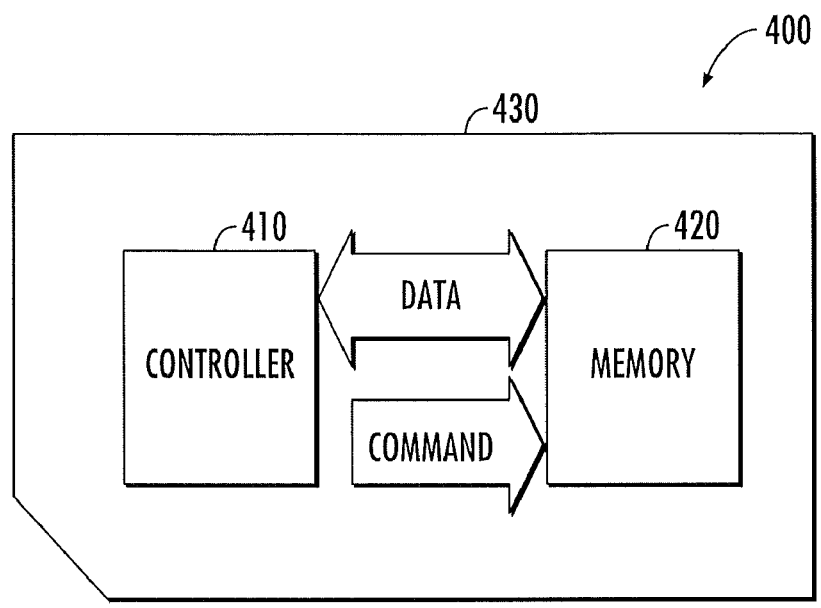
FIG. 11 is a block diagram illustrating a memory storage device including packaged integrated circuit devices according to some embodiments of the present inventive concept.

FIG. 11 is a block diagram illustrating a memory storage device 400 according to some embodiments of the present inventive concept. Referring now to FIG. 11, the memory storage device 400 includes a controller 410, a memory unit 420, and a printed circuit board 430 configured to provide communication between the controller 410 and the memory unit 420. The memory storage device 400 may further include an interface to an external system (not shown). Accordingly, the memory storage device 400 may be configured to input data into the memory unit 420 or output data to the external system. The memory unit 420 includes one or more of the multi-chip packages described above. In particular, the memory unit 420 may include one or more of the embodiments discussed above with reference to FIGS. 2-10. In some embodiments, the memory storage device 400 may be a MultiMediaCard (MMC), Secure Digital (SD) card, or a solid state drive (SSD).

Figure 12:
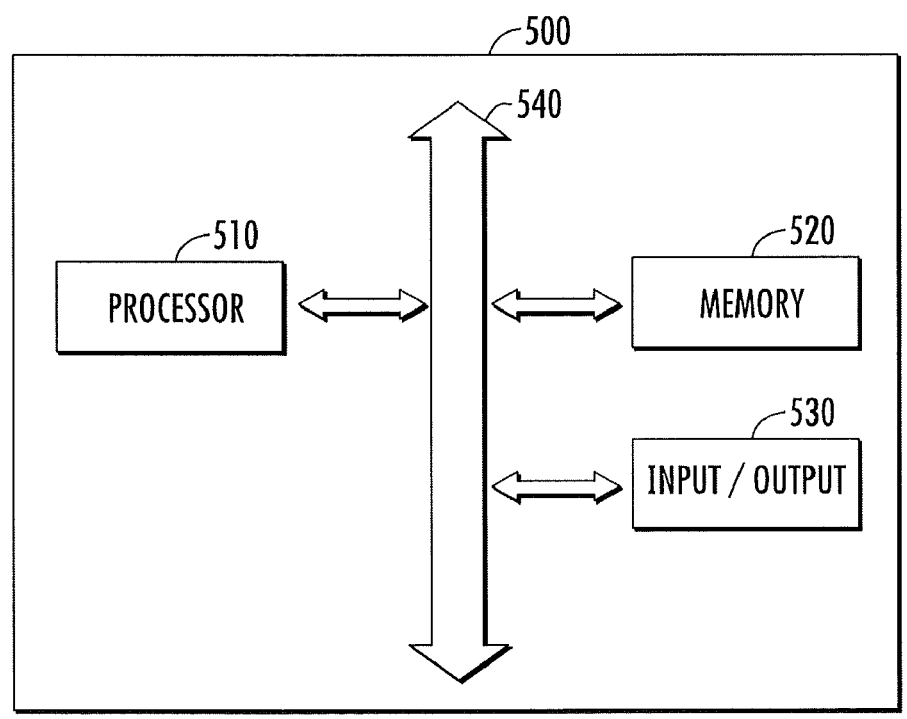
FIG. 12 is a block diagram illustrating an electronic system including packaged integrated circuit devices according to some embodiments of the present inventive concept.

FIG. 12 is a block diagram illustrating an electronic system 500 including packaged integrated circuit devices according to some embodiments of the present inventive concept. As shown in FIG. 12, the system 500 includes a processor 510, an input/output (I/O) unit 530, and a memory unit 520. A bus 540 communicatively couples the processor 510, the memory unit 520, and the I/O unit 530. The processor 510 and/or the memory unit 530 includes one or more packaged integrated circuit devices as described above. In particular, the processor 510 and/or memory unit 520 may include one or more of the embodiments discussed above with reference to FIGS. 2-10.

Embodiments of the present inventive concept may be employed in any electronic devices that use semiconductor-based memory, such as flash memory, dynamic random access memory (DRAM), ferroelectric random access memory (FeRAM), phase-changeable random access memory (PRAM), magnetic random access memory (MRAM), and/or resistive random access memory (RRAM). Examples of such electronic devices include computer systems, mobile/portable devices (such as mobile phones, MP3 players, and navigation systems), and/or household appliances.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

That which is claimed:

1. A packaged integrated circuit device, comprising:
a substrate including a conductive pad thereon;
a chip stack including a plurality of chips on the substrate;
a primary conductive line directly electrically connecting the pad on the substrate to a conductive pad on one of the plurality of chips in the chip stack, wherein the one of the plurality of chips is not directly on the substrate; and
secondary conductive lines directly contacting the conductive pad on the one of the plurality of chips having the primary conductive line connected thereto and providing electrical connections to respective conductive pads on ones of the plurality of chips above and below the one of the plurality of chips in the chip stack.

2. The device of claim 1, wherein the primary conductive line is configured to transmit a signal from the pad on the substrate to the pad on the one of the plurality of chips in the chip stack, and wherein the secondary conductive lines are configured to transmit the signal from the one of the plurality of chips to the ones of the plurality of chips above and below the one of the plurality of chips in the chip stack at a same time responsive to receiving the signal at the one of the plurality of chips to reduce a time difference between receiving the signal at the one of the plurality of chips to which the primary conductive line is connected and receiving the signal at last ones of the plurality of chips that are above and below the one of the plurality of chips in the chip stack.

3. The device of claim 2, wherein a first one of the secondary conductive lines connects the one of the plurality of chips to the ones of the plurality of chips thereabove in series, and wherein a second one of the secondary conductive lines connects the one of the plurality of chips to the ones of the plurality of chips therebelow in series and has a similar electrical length as the first one of the secondary conductive lines.

4. The device of claim 2, further comprising:
a ternary conductive line connecting one of the respective pads on a last one of the plurality of chips that is connected to one of the secondary conductive lines to a conductive pad on another one of the plurality of chips that is not directly thereon and configured to transmit the signal thereto; and
quaternary conductive lines connecting the conductive pad on the another one of the plurality of chips to respective conductive pads on ones of the plurality of chips in the chip stack above and below the another one of the plurality of chips and configured to simultaneously transmit the signal thereto.

5. The device of claim 1, wherein the signal transmitted via the primary and secondary conductive lines comprises at least one of an address signal, a data signal, and a command signal.

6. The device of claim 1, wherein the one of the plurality of chips is positioned in the chip stack near a middle position thereof such that each of the secondary conductive lines comprises a similar electrical length.

7. The device of claim 1, wherein the one of the plurality of chips and the chips therebelow define a first chip stack of a first multi-chip package, wherein the ones of the plurality of chips above the one of the plurality of chips define a second chip stack of a second multi-chip package to provide a package-on-package (PoP) structure, the second multi-chip package comprising:
a second substrate having the second chip stack thereon, the second substrate including a conductive pad thereon and external terminals electrically connected to the pad on the one of the plurality of chips in the first chip stack, wherein one of the secondary conductive lines connects the pad on the second substrate to the plurality of chips of the second chip stack.

8. The device of claim 1, wherein the primary conductive line comprises a first primary conductive line connecting the pad on the substrate to a controller chip that is configured to control operations of the plurality of chips in the chip stack, and a second primary conductive line connecting the controller chip to the one of the plurality of chips in the chip stack.

9. The device of claim 1, wherein the primary conductive line comprises at least one of a wirebond and a through molded via (TMV) directly connecting the pad on the substrate to the one of the plurality of chips, and wherein the secondary conductive lines respectively comprise conductive vias extending through the ones of the plurality of chips above and below the one of the plurality of chips.

10. The device of claim 1, wherein the plurality of chips in the chip stack comprise one of flash memory, dynamic random access memory (DRAM), static random access memory (SRAM), resistive random access memory (RRAM), and magnetic random access memory (MRAM) chips.

11. The device of claim 10, wherein the plurality of chips in the chip stack comprises eight memory chips or more.

12. A memory storage device, comprising:
a controller;
a memory unit; and
a printed circuit board including the controller and the memory unit thereon and configured to provide communication therebetween, wherein the memory unit comprises at least one packaged integrated circuit device, and wherein the at least one packaged integrated circuit device comprises:
a substrate including a conductive pad thereon;
a chip stack including a plurality of chips on the substrate;
a primary conductive line directly electrically connecting the pad on the substrate to a conductive pad on one of the plurality of chips in the chip stack, wherein the one of the plurality of chips is not directly on the substrate; and
secondary conductive lines directly contacting the conductive pad on the one of the plurality of chips having the primary conductive line connected thereto and providing electrical connections to respective conductive pads on ones of the plurality of chips above and below the one of the plurality of chips in the chip stack.

13. An electronic system, comprising:
a processor;
a memory unit;
an input/output unit; and
a bus that communicatively couples the processor, the memory, and the input/output unit, wherein at least one of the processor and the memory unit comprise at least one packaged integrated circuit device, and wherein the at least one packaged integrated circuit device comprises:
a substrate including a conductive pad thereon;
a chip stack including a plurality of chips on the substrate;
a primary conductive line directly electrically connecting the pad on the substrate to a conductive pad on one of the plurality of chips in the chip stack, wherein the one of the plurality of chips is not directly on the substrate; and
secondary conductive lines directly contacting the conductive pad on the one of the plurality of chips having the primary conductive line connected thereto and providing electrical connections to respective conductive pads on ones of the plurality of chips above and below the one of the plurality of chips in the chip stack.

14. A method of operating an integrated circuit device including a substrate and a chip stack including a plurality of chips thereon, the method comprising:
transmitting a signal from a conductive pad on the substrate to one of the plurality of chips in the chip stack via a primary conductive line that directly connects the pad on the substrate to a conductive pad on one of the plurality of chips, wherein the one of the plurality of chips is not directly on the substrate; and then
simultaneously transmitting the signal from the one of the plurality of chips to ones of the plurality of chips above and below the one of the plurality of chips in the chip stack via secondary conductive lines that directly contact the conductive pad on the one of the plurality of chips having the primary conductive line connected thereto and provide connections to respective conductive pads on the ones of the plurality of chips above and below the one of the plurality of chips in the chip stack,
wherein simultaneously transmitting reduces a time difference between receiving the signal at the one of the plurality of chips to which the primary conductive line is connected and receiving the signal at last ones of the plurality of chips that are above and below the one of the plurality of chips in the chip stack.

15. The method of claim 14, wherein, simultaneously transmitting the signal via the secondary conductive lines comprises:
serially transmitting the signal to the ones of the plurality of chips above the one of the plurality of chips via a first one of the secondary conductive lines that connects the one of the plurality of chips to the ones of the plurality of chips thereabove; and
serially transmitting the signal to the ones of the plurality of chips below the one of the plurality of chips via a second one of the secondary conductive lines that connects the one of the plurality of chips to the ones of the plurality of chips therebelow and has a similar electrical length as the first one of the secondary conductive lines.

16. The method of claim 14, further comprising:
transmitting the signal from one of the respective pads on a last one of the plurality of chips connected to one of the secondary conductive lines to a conductive pad on another one of the plurality of chips that is not directly thereon via a ternary conductive line; and
simultaneously transmitting the signal from the pad on the another one of the plurality of chips to respective conductive pads on ones of the plurality of chips in the chip stack above and below the another one of the plurality of chips via quaternary conductive lines.

17. The method of claim 14, wherein the signal comprises at least one of an address signal, a data signal, and a command signal.

18. The method of claim 14, wherein the one of the plurality of chips is positioned in the chip stack near a middle position thereof such that each of the secondary conductive lines comprises a similar electrical length.

19. The method of claim 14, wherein the one of the plurality of chips and the chips therebelow define a first chip stack of a first multi-chip package, wherein the ones of the plurality of chips above the one of the plurality of chips define a second chip stack of a second multi-chip package to provide a package-on-package (PoP) structure, the second multi-chip package comprising a second substrate having the second chip stack thereon, the second substrate including a conductive pad thereon and external terminals electrically connected to the pad on the last one of the plurality of chips in the first chip stack, wherein one of the secondary conductive lines connects the pad on the second substrate to the plurality of chips of the second chip stack.

20. The method of claim 14, wherein the primary conductive line comprises a first primary conductive line connecting the pad on the substrate to a controller chip that is configured to control operations of the plurality of chips in the chip stack, and a second primary conductive line connecting the controller chip to the one of the plurality of chips in the chip stack, and wherein transmitting the signal from the pad on the substrate to the one of the plurality of chips in the chip stack comprises:
 transmitting a control signal from the substrate to the controller chip via the first primary conductive line; and then
 transmitting the signal from the controller chip to the one of the plurality of chips in the chip stack via the secondary conductive line.

21. The method of claim 14, wherein the primary conductive line comprises at least one of a wirebond and a through molded via (TMV) directly connecting the pad on the substrate to the one of the plurality of chips, and wherein the secondary conductive lines comprise respective conductive vias extending through the ones of the plurality of chips above and below the one of the plurality of chips.

22. A packaged integrated circuit device, comprising:
 a substrate including a conductive pad thereon;
 a chip stack including a plurality of chips on the substrate;
 a primary conductive line directly connecting the pad on the substrate to a conductive pad on one of the plurality of chips in the chip stack and configured to transmit a signal from the substrate thereto;
 secondary conductive lines directly contacting the conductive pad on the one of the plurality of chips to provide connections to respective conductive pads on ones of the plurality of chips above and below the one of the plurality of chips in the chip stack and configured to simultaneously transmit the signal thereto responsive to receiving the signal at the one of the plurality of chips;
 a ternary conductive line directly connecting one of the respective pads on a last one of the plurality of chips that is connected to one of the secondary conductive lines to a conductive pad on another one of the plurality of chips and configured to transmit the signal thereto responsive to receiving the signal at the last one of the plurality of chips that is connected to the one of the secondary conductive lines, wherein the another one of the plurality of chips is not directly on the last one of the plurality of chips; and
 quaternary conductive lines directly contacting the conductive pad on the another one of the plurality of chips to provide connections to respective conductive pads on ones of the plurality of chips in the chip stack above and below the another one of the plurality of chips and configured to simultaneously transmit the signal thereto responsive to receiving the signal at the another one of the plurality of chips.

* * * * *